(12) United States Patent
Murata

(10) Patent No.: US 11,362,019 B2
(45) Date of Patent: Jun. 14, 2022

(54) SEMICONDUCTOR DEVICE COMPRISING SEALING MEMBERS WITH DIFFERENT ELASTIC MODULUS AND METHOD FOR MANUFACTURING SEMICONDUCTOR DEVICE

(71) Applicant: Mitsubishi Electric Corporation, Tokyo (JP)

(72) Inventor: Daisuke Murata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/848,770

(22) Filed: Apr. 14, 2020

(65) Prior Publication Data
US 2021/0098344 A1    Apr. 1, 2021

(30) Foreign Application Priority Data

Sep. 30, 2019   (JP) ............................. JP2019-178966

(51) Int. Cl.
| H01L 23/49 | (2006.01) |
| H01L 21/48 | (2006.01) |
| H01L 23/492 | (2006.01) |
| H01L 23/31 | (2006.01) |
| H01L 23/00 | (2006.01) |

(52) U.S. Cl.
CPC ........ *H01L 23/492* (2013.01); *H01L 21/4871* (2013.01); *H01L 23/3114* (2013.01); *H01L 24/13* (2013.01); *H01L 24/45* (2013.01); *H01L 24/73* (2013.01); *H01L 24/85* (2013.01)

(58) Field of Classification Search
CPC ............... H01L 23/492; H01L 21/4871; H01L 23/3114; H01L 24/13; H01L 24/45; H01L 24/46; H01L 24/85

USPC .................................. 257/678; 438/106, 121
See application file for complete search history.

(56) References Cited

U.S. PATENT DOCUMENTS

| 10,304,788 B1* | 5/2019 | Kim ........................ H01L 23/24 |
| 2004/0164385 A1* | 8/2004 | Kado ...................... H01L 24/14 |
| | | 257/678 |
| 2006/0061974 A1* | 3/2006 | Soga ....................... H01L 24/33 |
| | | 361/743 |
| 2012/0199991 A1* | 8/2012 | Okamoto ............ H01L 23/3142 |
| | | 257/E23.117 |
| 2015/0076517 A1* | 3/2015 | Terai ................... H01L 23/3135 |
| | | 257/77 |
| 2019/0043827 A1* | 2/2019 | Ito .......................... H01L 23/29 |

FOREIGN PATENT DOCUMENTS

WO      2013/111276 A1    8/2013

* cited by examiner

*Primary Examiner* — Didarul A Mazumder
(74) *Attorney, Agent, or Firm* — Studebaker & Brackett PC

(57) ABSTRACT

According to an aspect of the present disclosure, a semiconductor device includes a base plate, a first semiconductor chip provided above the base plate, a bonding wire joined with the first semiconductor chip at a first joint part and having a curved part above the first joint part, a first sealing member provided from an upper surface of the base plate up to a height higher than the first joint part and lower than the curved part, the first sealing member covering the first joint part and a second sealing member provided on the first sealing member, covering the curved part, and having an elastic modulus lower than an elastic modulus of the first sealing member.

12 Claims, 7 Drawing Sheets

STEP1

STEP2

STEP3

STEP4

STEP5

STEP7

SEMICONDUCTOR DEVICE COMPRISING SEALING MEMBERS WITH DIFFERENT ELASTIC MODULUS AND METHOD FOR MANUFACTURING SEMICONDUCTOR DEVICE

BACKGROUND OF THE INVENTION

Field

The present disclosure relates to a semiconductor device and a method for manufacturing a semiconductor device.

Background

International Publication No. 2013/111276 discloses a power semiconductor apparatus with a sealing resin resistant to cracking. The power semiconductor apparatus is provided with a semiconductor device substrate where a surface electrode pattern is formed, and a power semiconductor device fixed to the surface electrode pattern via a joint material. On the surface electrode pattern, a partition wall is provided so as to surround the power semiconductor device. The inside of the partition wall is filled with a first sealing resin that covers the power semiconductor device and the surface electrode pattern inside the partition wall. The partition wall, the first sealing resin, and the semiconductor device substrate exposed outward from the partition wall are covered with a second sealing resin. The elastic modulus of the second sealing resin is smaller than the elastic modulus of the first sealing resin.

In International Publication No. 2013/111276, a bonding wire inside the partition wall is covered with the high-modulus sealing material. At this time, a thermal stress on a loop portion of the bonding wire increases, which might cause a crack to occur in the loop portion.

SUMMARY

The present disclosure has been made to solve the above-described problem, and has an object to provide a semiconductor device and a method for manufacturing a semiconductor device which are able to prevent damage to a bonding wire.

The features and advantages of the present disclosure may be summarized as follows.

According to one aspect of the present disclosure, a semiconductor device includes a base plate, a first semiconductor chip provided above the base plate, a bonding wire joined with the first semiconductor chip at a first joint part and having a curved part above the first joint part, a first sealing member provided from an upper surface of the base plate up to a height higher than the first joint part and lower than the curved part, the first sealing member covering the first joint part and a second sealing member provided on the first sealing member, covering the curved part, and having an elastic modulus lower than an elastic modulus of the first sealing member.

According to another aspect of the present disclosure, a method for manufacturing a semiconductor device includes providing a semiconductor chip above a base plate, joining the semiconductor chip and a bonding wire to form in the bonding wire a curved part above a joint part with the semiconductor chip, sealing, with the first sealing member, an area from an upper surface of the base plate up to a height higher than the joint part and lower than the curved part, to cover the joint part with the first sealing member and sealing an upper surface of the first sealing member with a second sealing member having an elastic modulus lower than an elastic modulus of the first sealing member, to cover the curved part with the second sealing member.

Other and further objects, features and advantages of the disclosure will appear more fully from the following description.

DESCRIPTION OF EMBODIMENTS

Figure 1:
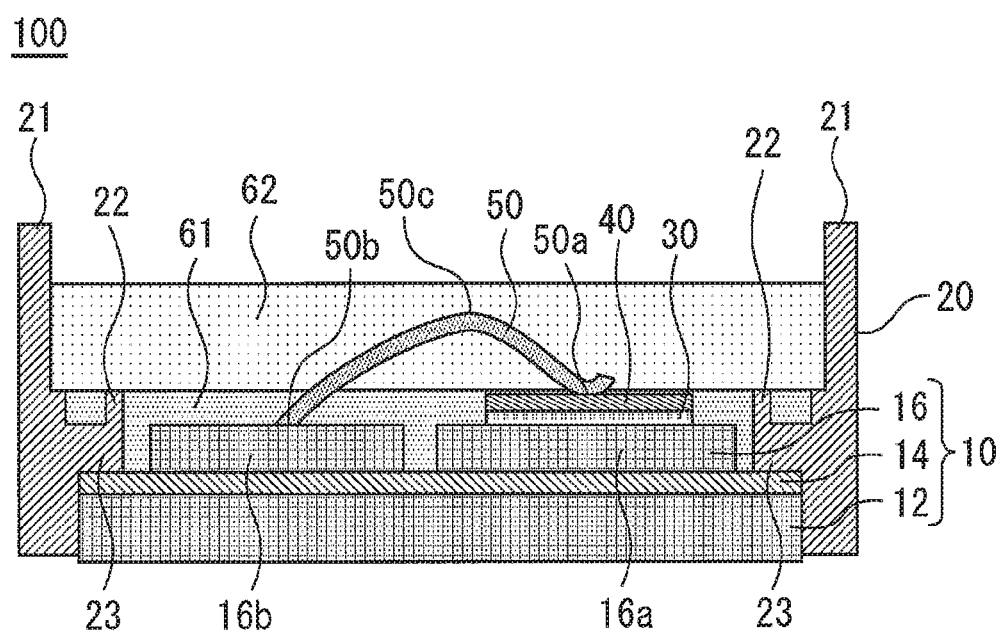
FIG. 1 is a cross-sectional view of a semiconductor device according to a first embodiment.

A semiconductor device and a method for manufacturing a semiconductor device according to an embodiment of the present disclosure will be described with reference to the accompanying drawings. Components identical or corresponding to each other are indicated by the same reference characters, and repeated description of them is avoided in some cases.

First Embodiment

FIG. 1 is a cross-sectional view of a semiconductor device 100 according to a first embodiment. The semiconductor device 100 is, for example, a power semiconductor device. The semiconductor device 100 is provided with an insulating substrate 10. The insulating substrate 10 is, for example, a resin insulating substrate. The use of the resin insulating substrate enables reduction in stress from a sealing member on the insulating substrate 10. The insulating substrate 10 has a base plate 12, an insulating layer 14 provided on the base plate 12, and a circuit pattern 16 provided on the insulating layer 14. The insulating layer 14 is formed from a resin, for example. The circuit pattern 16 includes circuit patterns 16a, 16b.

A semiconductor chip 40 is provided on the insulating substrate 10. The semiconductor chip 40 is, for example, a power chip. The semiconductor chip 40 may, for example, be an insulated gate bipolar transistor (IGBT). The semiconductor chip 40 is joined to a circuit pattern 16a by a joint material 30. The joint material 30 is, for example, solder.

The semiconductor chip 40 and the circuit pattern 16b are connected by a bonding wire 50. The bonding wire 50 is joined with a semiconductor chip 40 at a first joint part 50a. The first joint part 50a is provided on the upper surface of the semiconductor chip 40. The bonding wire 50 is joined with the circuit pattern 16b at a second joint part 50b. Further, the bonding wire 50 has a curved part 50c above the first joint part 50a. The curved part 50c is provided between the first joint part 50a and the second joint part 50b. The curved part 50c is, for example, a portion provided at the highest position of the bonding wire 50. Being not limited to this, the curved part 50c may only be a curved part of the bonding wire 50.

The semiconductor device 100 is provided with a case 20 surrounding the insulating substrate 10. The case 20 has an outer wall part 21 surrounding the insulating substrate 10. Further, the case 20 has a ride-on part 23 projecting inward from the outer wall part 21. The ride-on part 23 rides on the periphery of the insulating substrate 10. In the present embodiment, the ride-on part 23 is provided outside the circuit patterns 16a, 16b. The ride-on part 23 has a recess 22. The recess 22 is open upward.

The inside of the case 20 is sealed with a first sealing member 61 and a second sealing member 62. The first sealing member 61 is provided from the upper surface of the insulating layer 14 up to a height higher than the first joint part 50a and lower than the curved part 50c. The first sealing member 61 fills the inside of the case 20 up to a first height of a predetermined level. The first sealing member 61 covers a part of the bonding wire 50, the semiconductor chip 40, the circuit patterns 16a, 16b, the insulating layer 14, and the joint material 30. In particular, the first sealing member 61 covers the first joint part 50a and the second joint part 50b.

The recess 22 in the case 20 has an opening surface at the height of the upper surface of the first sealing member 61. The first sealing member 61 fills the inside of the recess 22.

The second sealing member 62 is provided on the first sealing member 61. The second sealing member 62 fills the case 20 up to a second height of a predetermined level. The second sealing member 62 covers the curved part 50c. The second sealing member 62 has an elastic modulus lower than that of the first sealing member 61.

Figure 2:
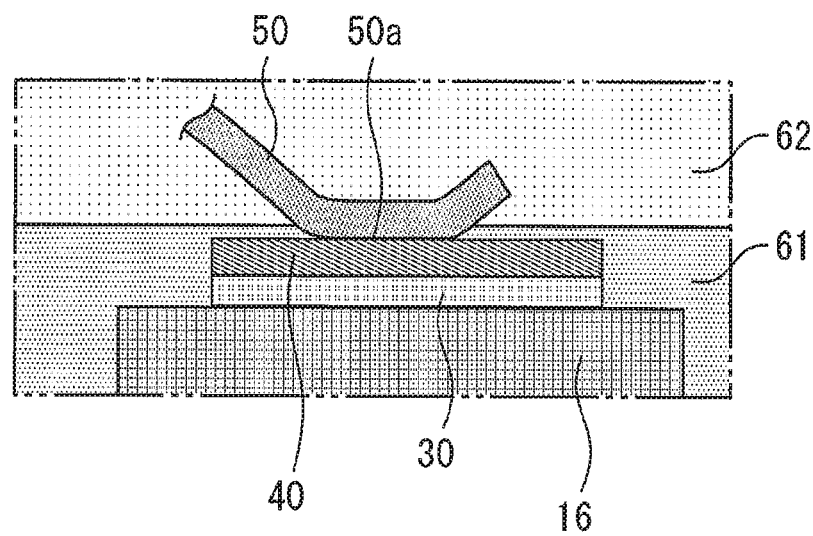
FIG. 2 is an enlarged view of the first joint part according to the first embodiment.

FIG. 2 is an enlarged view of the first joint part 50a according to the first embodiment. The upper surface of the first sealing member 61 is provided within the range of the wire diameter of the bonding wire 50 from the upper surface of the semiconductor chip 40. That is, the interface of the first sealing member 61 and the second sealing member 62 is provided at a height between the joint surface of the semiconductor chip 40 and the bonding wire 50 and the upper surface of the bonding wire 50.

In general, by covering, with a high-modulus sealing material, a joint part of a wire and a semiconductor chip and a joint material for a semiconductor chip and a circuit pattern, it is possible to prevent a crack from occurring in the joint part or the joint material. Here, the bonding wire wired from the semiconductor chip may be connected to the circuit pattern in consideration of heat dissipation. When the bonding wire is covered with the high-modulus sealing material, a thermal stress on a wire loop section may increase. At this time, a crack might occur in the loop portion. Further, the progress of the crack in the loop portion might be promoted to cause the bonding wire to be broken. In particular, when the sealing is made with a high-modulus epoxy resin, a crack is likely to occur in the wire loop section rather than the joint surface between the bonding wire and the semiconductor chip.

Further, when the joint material for joining the semiconductor chip and the circuit pattern is covered with a low-modulus sealing material, a thermal stress which is applied to the joint material is large, and the joint material might be likely to further deteriorate.

In contrast, in the present embodiment, the first joint part 50a of the bonding wire 50 and the semiconductor chip 40 is sealed with the high-modulus first sealing member 61, and the curved part 50c of the bonding wire 50 is sealed with the low-modulus second sealing member 62. Therefore, at the first joint part 50a, damage such as a crack can be prevented from occurring in the semiconductor chip 40 and the bonding wire 50. Also, damage such a crack in the curved part 50c of the bonding wire 50 can be prevented. Further, a crack can be prevented from progressing. Therefore, it is thus possible to extend the life of the semiconductor device 100.

In the present embodiment, the second joint part 50b is also sealed with the high-modulus first sealing member 61. In the present embodiment, all joint parts of the bonding wire 50 are covered with the first sealing member 61. Therefore, at the second joint part 50b, damage such as a crack can be prevented from occurring in the circuit pattern 16b and the bonding wire 50.

Furthermore, the joint material 30 for joining the semiconductor chip 40 and the circuit pattern 16a is covered with the high-modulus first sealing member 61. Hence it is possible to reduce a stress that is applied to the joint material 30 and prevent the deterioration in the joint material 30.

The first height of the upper surface of the first sealing member 61 is set within the range of the wire diameter of the bonding wire 50 from the upper surface of the semiconductor chip 40. This makes it possible to ensure a large portion of the bonding wire 50 covered with the second sealing member 62 while sealing the first joint part 50a and the second joint part 50b with the first sealing member 61. Hence it is possible to reduce a stress that is applied to the bonding wire 50 provided by curvature. Therefore, the occurrence of damage to the bonding wire 50 can further be prevented.

As a comparative example of the present embodiment, it is conceivable that the high-modulus sealing member covers only the joint part of the bonding wire with the semiconductor chip. With such a configuration, especially when many semiconductor chips are provided in the case, there are considered to be many places where the high-modulus sealing member is to be provided. At this time, the difference is considered to occur among the sealing members in the elapsed time from the provision of the sealing member. There is hence a possibility that the difference occurs among the sealing members in the spread of the resin. Therefore, it might be difficult to control the height of the resin.

In contrast, in the present embodiment, the first sealing member 61 is provided from the upper surface of the insulating substrate 10 up to the first height of a predetermined level. This can facilitate the control of the height of the first sealing member 61. The second sealing member 62 is provided on the upper surface of the evenly provided first sealing member 61. This can facilitate the control of the height of the second sealing member 62.

Furthermore, in the present embodiment, the recess 22 is provided in the case 20. The recess 22 has the opening surface at the height of a target height of the first sealing member 61. By filling the recess 22 with the first sealing member 61 up to the opening surface, the first sealing member 61 can be provided up to the first height. Therefore, the confirmation of the height of the first sealing member 61 can be facilitated. Further, the height of the first sealing member 61 can be controlled accurately.

In the present embodiment, the first height of the upper surface of the first sealing member 61 may only be higher than the first joint part 50a and lower than the curved part 50c. For example, the first sealing member 61 may be provided up to a height to cover a large portion of the bonding wire 50 except for the curved part 50c.

In the present embodiment, the second joint part 50b is provided below the first joint part 50a. For this reason, when the first joint part 50a is covered with the first sealing member 61, the second joint part 50b is also covered spontaneously with the first sealing member 61. Being not limited to this, the second joint part 50b may be provided at a height the same as the first joint part 50a or above the first joint part 50a. In this instance, the first height of the upper surface of the first sealing member 61 may be higher than the second joint part 50b and lower than the curved part 50c.

The bonding wire 50 may be connected to an element except for the circuit pattern 16b. For example, the semiconductor chip 40 may be connected to another semiconductor chip or electrode by the bonding wire 50. In this instance, the second joint part 50b is provided in another chip or electrode.

A depression formed in the recess 22 in FIG. 1 is quadrangular in a cross-sectional view. The shape of the recess is not limited to this. The recess may be triangular, polygonal, or semicircular.

The height of the opening surface of the recess 22 may only be provided near the interface of the first sealing member 61 and the second sealing member 62. The recess 22 may be a guide at the time of the filling with the first sealing member 61. The height of the opening surface of the recess 22 may be higher or lower than the target height of the first sealing member 61.

The first sealing member 61, for example, passes over the side surface of the recess 22 and flows into the inside of the recess 22. A groove to be a flow path for the first sealing member 61 may be formed on the side surface of the recess 22. The opening surface of the recess 22 may not face upward. For example, the opening surface of the recess 22 may face in the horizontal direction. The horizontal direction is a direction parallel to the upper surface of the base plate 12.

The elastic modulus of the first sealing member 61 is preferably 10 GPa or more. The first sealing member 61 is preferably 10 to 30 GPa of the epoxy resin, for example. The elastic modulus of the second sealing member 62 is preferably 10 GPa or less. The second sealing member 62 may, for example, be silicone gel.

The semiconductor chip 40 may be made with a wide bandgap semiconductor. The wide bandgap semiconductor is, for example, a silicon carbide-based or gallium nitride-based material or diamond. It is thereby possible to further improve the heat resistance of the semiconductor device 100.

Figure 3:
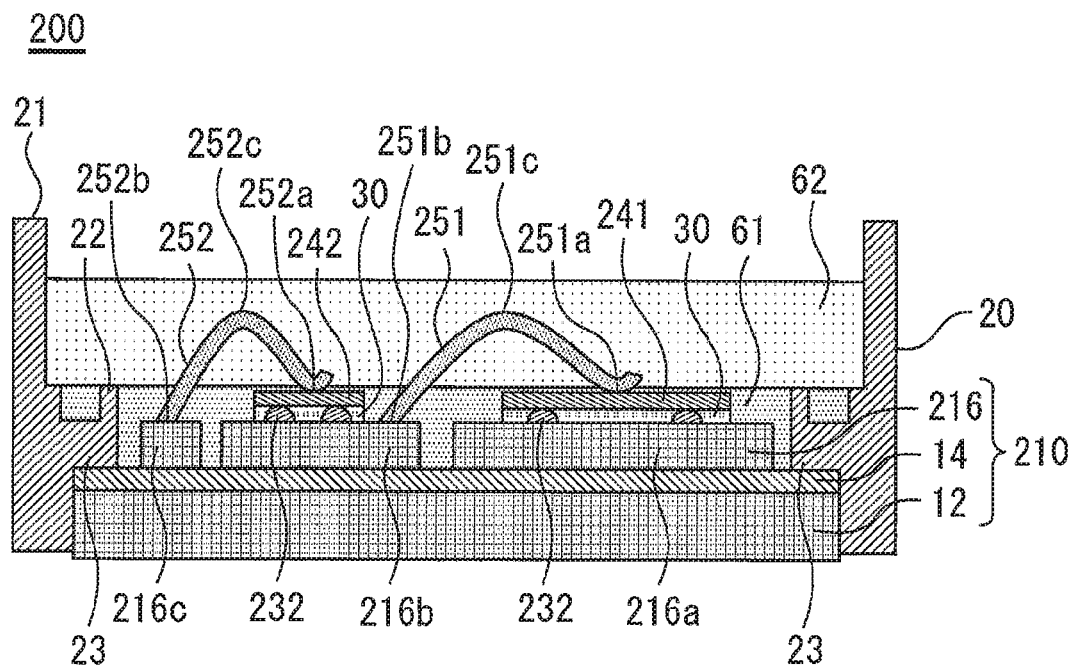
FIG. 3 is a cross-sectional view of a semiconductor device according to a first modification of the first embodiment.

FIG. 3 is a cross-sectional view of a semiconductor device 200 according to a first modification of the first embodiment. The semiconductor device 200 is provided with an insulating substrate 210. The insulating substrate 210 has circuit patterns 216a to 216c as a circuit pattern 216. A bump 232 is provided on each of the circuit patterns 216a, 216b. The bump 232 is formed using an aluminum wire or the like.

On the insulating substrate 210, a first semiconductor chip 241 and a second semiconductor chip 242 are provided. The first semiconductor chip 241 and the second semiconductor chip 242 may be the same type of semiconductor chips or may be different types of semiconductor chips. For example, one of the first semiconductor chip 241 and the second semiconductor chip 242 may be an IGBT and the other may be a diode.

The first semiconductor chip 241 is provided on the bump 232 on the circuit pattern 216a. In the state of being mounted on the bump 232, the first semiconductor chip 241 is joined with the circuit pattern 216a by the joint material 30. The second semiconductor chip 242 is provided on the bump 232 on the circuit pattern 216b. In the state of being mounted on the bump 232, the second semiconductor chip 242 is joined with the circuit pattern 216b by the joint material 30. The joint material 30 is provided so as to surround the bump 232.

The first semiconductor chip 241 and the circuit pattern 216b are connected by a bonding wire 251. The bonding wire 251 is joined with the first semiconductor chip 241 at a first joint part 251a. The bonding wire 251 is joined with the circuit pattern 216b at a second joint part 251b. Further, the bonding wire 251 has a curved part 251c above the first joint part 251a.

The second semiconductor chip 242 and the circuit pattern 216c are connected by a bonding wire 252. The bonding wire 252 is joined with the second semiconductor chip 242 at a first joint part 252a. The bonding wire 252 is joined with the circuit pattern 216c at a second joint part 252b. Further, the bonding wire 252 has a curved part 252c above the first joint part 252a.

The upper surfaces of the first semiconductor chip 241 and the second semiconductor chip 242 are level with each other. The first sealing member 61 is provided from the upper surface of the insulating layer 14 up to a height higher than the first joint parts 251a, 252a and lower than the curved parts 251c, 252c. The first sealing member 61 covers the first joint parts 251a, 252a, the second joint parts 251b, 252b, and the joint material 30. The second sealing member 62 covers the curved parts 251c, 252c.

In the semiconductor device 200, the heights of the first semiconductor chip 241 and the second semiconductor chip 242 can be adjusted by the bumps 232. Thus, for example, when the first semiconductor chip 241 and the second semiconductor chip 242 are excessively low relative to the height of the opening surface of the recess 22, the heights of the first semiconductor chip 241 and the second semiconductor chip 242 can be ensured by the bumps 232.

Each of the first semiconductor chip 241 and the second semiconductor chip 242 is in contact with the bump 232. For this reason, the inclination of each of the first semiconductor chip 241 and the second semiconductor chip 242 can be made uniform. Further, a uniformly finished joint between the first semiconductor chip 241 and the second semiconductor chip 242 can be achieved. This can facilitate to level a plurality of semiconductor chips with each other.

Figure 4:
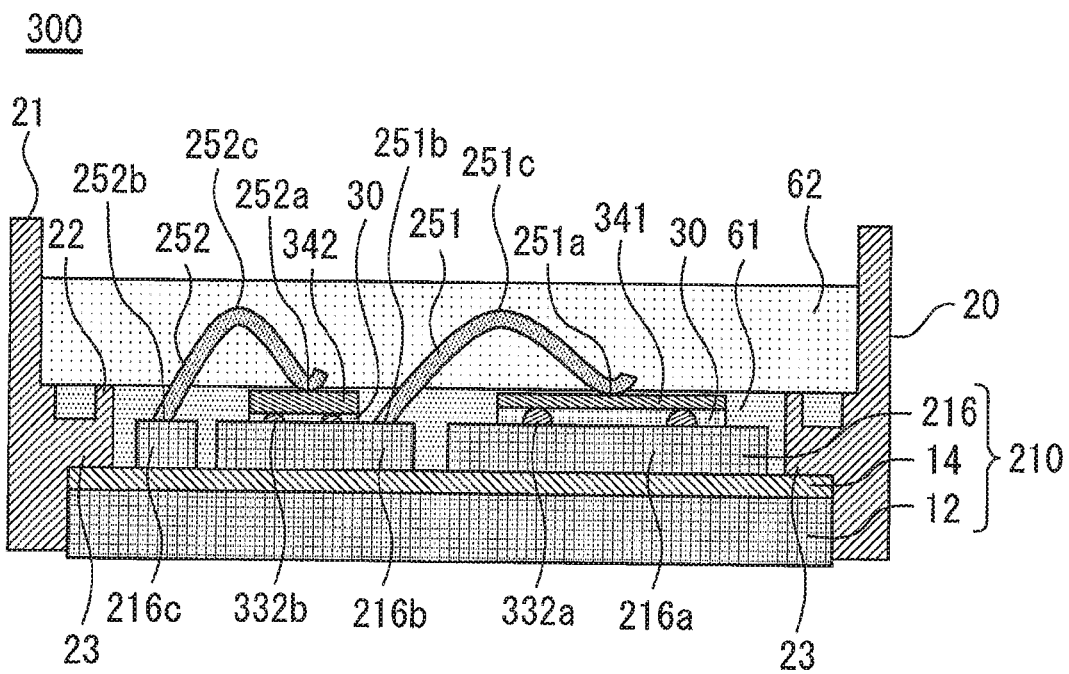
FIG. 4 is a cross-sectional view of a semiconductor device according to a second modification of the first embodiment.

FIG. 4 is a cross-sectional view of a semiconductor device 300 according to a second modification of the first embodiment. In the semiconductor device 300, a first bump 332a is provided on the circuit pattern 216a. A first semiconductor chip 341 is provided on the first bump 332a. A second bump 332b is provided on the circuit pattern 216b. The second bump 332b is shorter than the first bump 332a. A second semiconductor chip 342 is provided on the second bump 332b. The second semiconductor chip 342 is thicker than the first semiconductor chip 341. The upper surface of the first semiconductor chip 341 and the upper surface of the second semiconductor chip 342 are level with each other.

As thus described, even when the semiconductor device 300 is provided with a plurality of semiconductor chips having different thicknesses, the semiconductor chips can be level with each other by using the bumps with different heights. It is thereby possible to standardize the case 20 or the insulating substrate 210. Note that the thicknesses of the circuit patterns 216a to 216c are equal in the present modification.

Here, the example has been shown where there are two types of thicknesses of the semiconductor chips. Being not limited to this, the semiconductor device 300 may be provided with three or more types of semiconductor chips having different thicknesses. In this instance as well, the semiconductor chips can be level with each other by using three or more types of bumps having different heights.

Figure 5:
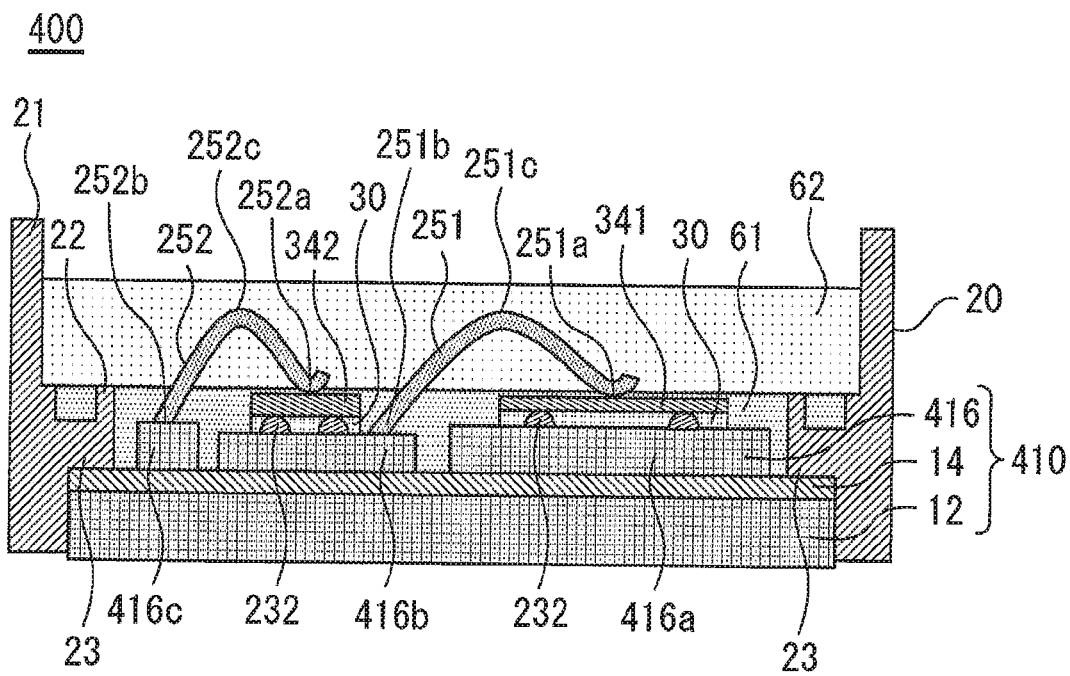
FIG. 5 is a cross-sectional view of a semiconductor device according to a third modification of the first embodiment.

FIG. 5 is a cross-sectional view of a semiconductor device 400 according to a third modification of the first embodiment. The semiconductor device 400 is provided with an insulating substrate 410. In the insulating substrate 410, a circuit pattern 416 is provided on the base plate 12 via the insulating layer 14. The circuit pattern 416 includes circuit pattern 416a to 416c. The circuit pattern 416b is thinner than the circuit pattern 416a. The bump 232 is provided on each of the circuit patterns 416a, 416b. The heights of the plurality of bumps 232 are the same in the present modification.

The first semiconductor chip 341 is provided on the circuit pattern 416a. The second semiconductor chip 342 is provided on the circuit pattern 416b. The second semiconductor chip 342 is thicker than the first semiconductor chip 341. The upper surface of the first semiconductor chip 341 and the upper surface of the second semiconductor chip 342 are level with each other.

As thus described, the thickness of the circuit pattern 416 may be adjusted to level the upper surfaces of the plurality of semiconductor chips having different heights. Here, the example has been shown where there are two types of thicknesses of the semiconductor chips. Being not limited to this, the semiconductor device 400 may be provided with three or more types of semiconductor chips having different heights. In this instance as well, the semiconductor chips can be level with each other by the circuit patterns 416 having different thicknesses.

Figure 6:
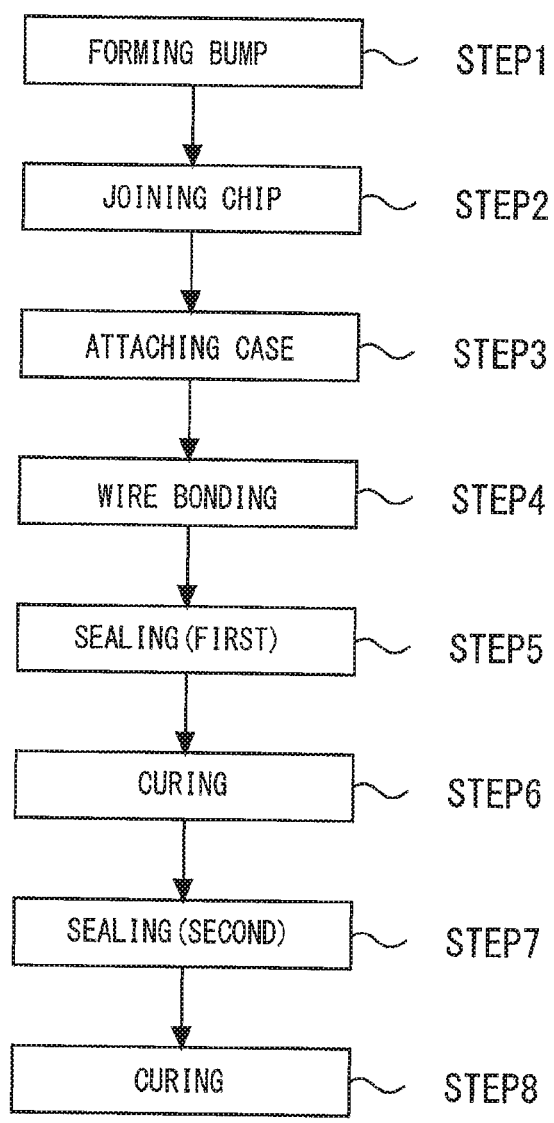
FIG. 6 is a flowchart illustrating a method for manufacturing the semiconductor device according to the first modification of the first embodiment.

FIG. 6 is a flowchart illustrating a method for manufacturing the semiconductor device 200 according to the first modification of the first embodiment. The method for manufacturing the semiconductor device 200 will be described using FIGS. 6 to 12.

Figure 7:
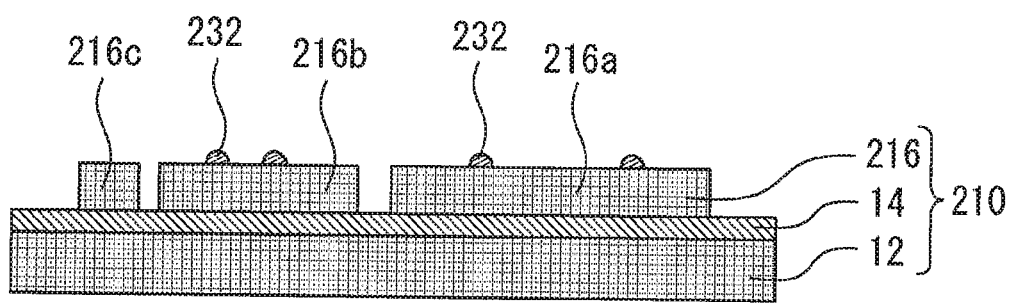
FIG. 7 is a diagram illustrating a state where the bump has been formed on the circuit pattern.

First, as step 1, the bump 232 is formed on the insulating substrate 210. FIG. 7 is a diagram illustrating a state where the bump 232 has been formed on the circuit pattern 216. The number of bumps 232 can be adjusted as needed. The height of the bump 232 is adjusted so that, with the semiconductor chip mounted on the bump 232, the upper surface of the semiconductor chip is lower than the target height of the first sealing member 61 and is within the range of the wire diameter from the target height. Note that the bump 232 may not be provided.

Figure 8:
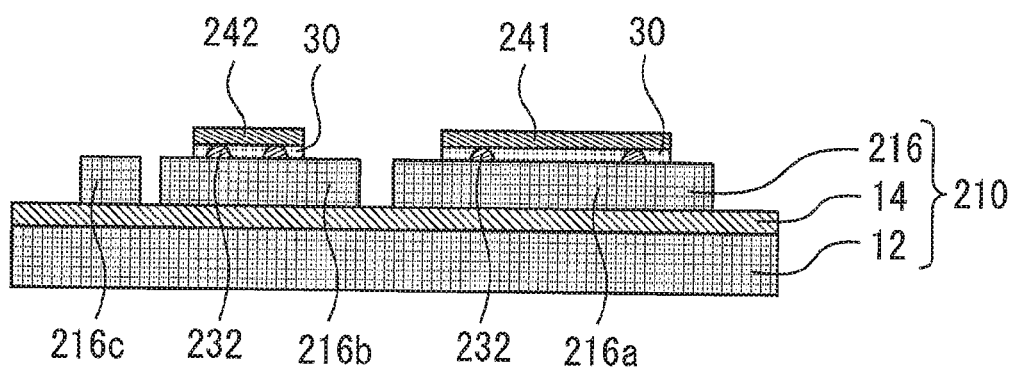
FIG. 8 is a view illustrating a state where each of the first semiconductor chip and the second semiconductor chip has been mounted on the bumps.

Next, as step 2, the first semiconductor chip 241 and the second semiconductor chip 242 are provided on the bumps 232, and the first semiconductor chip 241 and the second semiconductor chip 242 are joined. FIG. 8 is a view illustrating a state where each of the first semiconductor chip 241 and the second semiconductor chip 242 has been mounted on the bumps 232. In the state of being mounted on the bump 232, each of the first semiconductor chip 241 and the second semiconductor chip 242 is joined with the circuit pattern 216 by the joint material 30.

Figure 9:
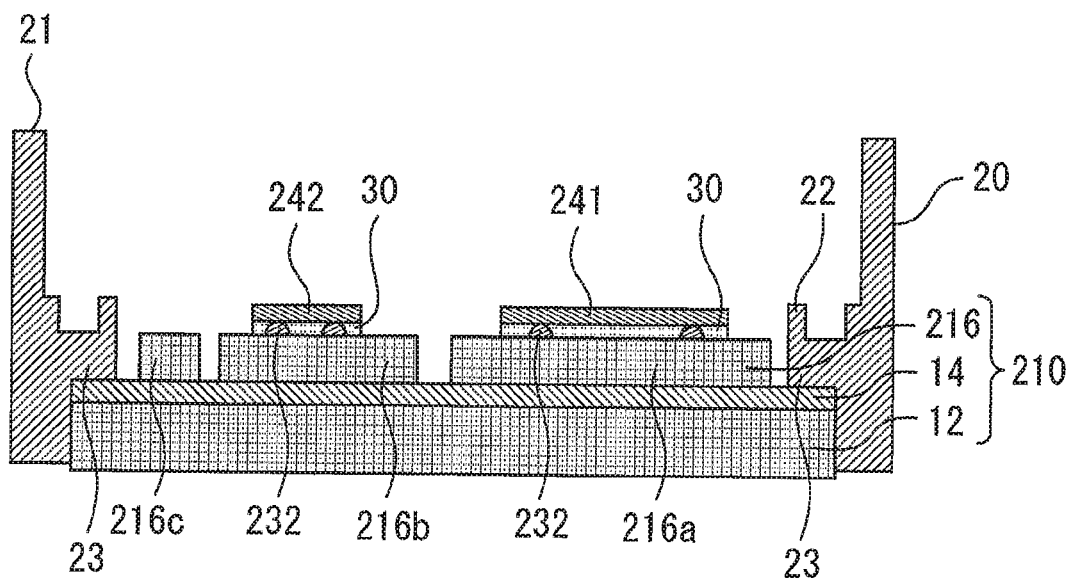
FIG. 9 is a view illustrating a state where the case has been mounted on the insulating substrate.

Then, the case is attached as step 3. FIG. 9 is a view illustrating a state where the case 20 has been mounted on the insulating substrate 210. The case 20 is joined to the insulating substrate 210 with an adhesive. The adhesive is, for example, a silicone adhesive or an epoxy adhesive.

Figure 10:
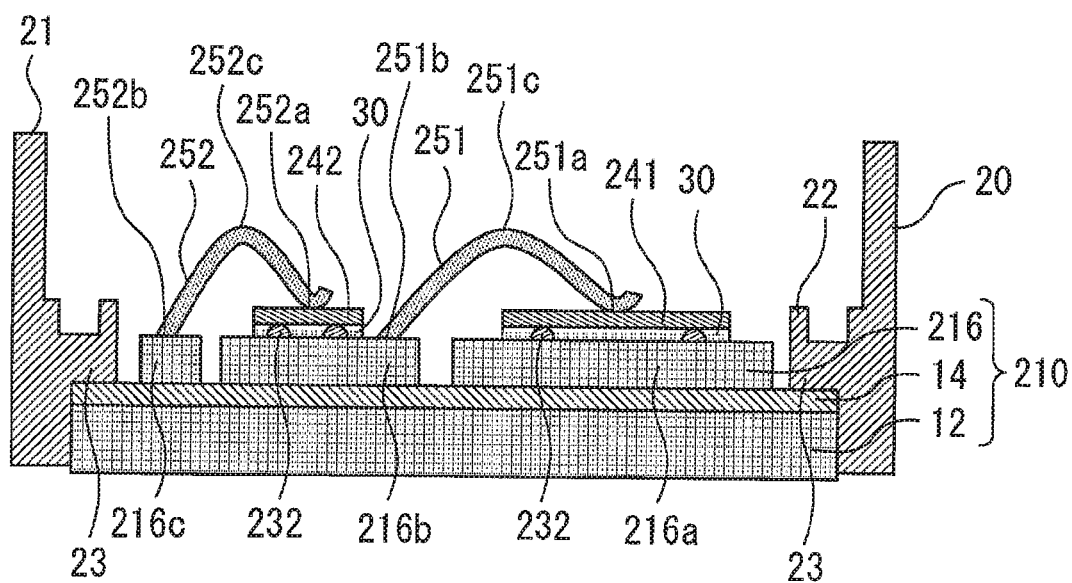
FIG. 10 is a view illustrating a state where bonding wires have been formed.

Subsequently, wire bonding is performed as step 4. FIG. 10 is a view illustrating a state where bonding wires 251, 252 have been formed. Thereby, the first semiconductor chip 241 and the bonding wire 251 are joined. At this time, the curved part 251c is formed in the bonding wire 251 above the first joint part 251a with the first semiconductor chip 241. Further, the second semiconductor chip 242 and the bonding wire 252 are jointed. At this time, a curved part 252c is formed in the bonding wire 252 above the first joint part 252a with the second semiconductor chip 242.

Figure 11:
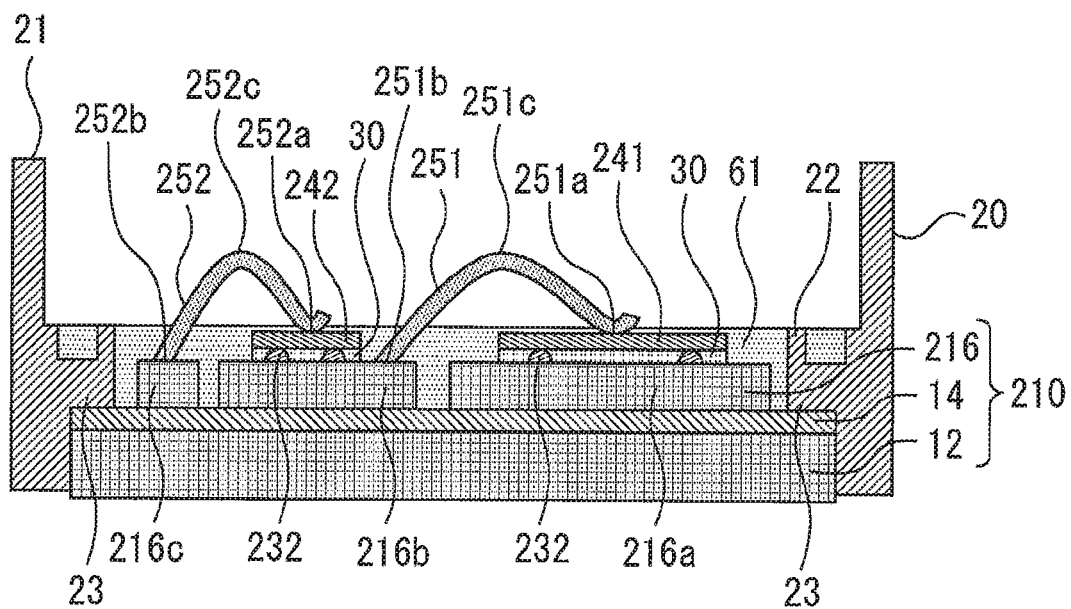
FIG. 11 is a view illustrating a state where the first sealing member has been provided.

Next, first sealing is performed as step 5. FIG. 11 is a view illustrating a state where the first sealing member 61 has been provided. In the first sealing, the sealing is performed with the first sealing member 61 from the upper surface of the insulating substrate 210 up to a height higher than the first joint parts 251a, 252a and lower than the curved parts 251c, 252c. Thereby, the first joint parts 251a, 252a, the second joint part 251b, 252b, and the joint material 30 are covered with the first sealing member 61. At this time, the filling is performed with the first sealing member 61, using the opening surface of the recess 22 in the case 20 as a guide.

Further, when the heights of the curved parts 251c, 252c are different, the sealing may be performed with the first sealing member 61 up to a height lower than the lowest curved part of the plurality of curved parts 251c, 252c.

Then, curing is performed as step 6.

Figure 12:
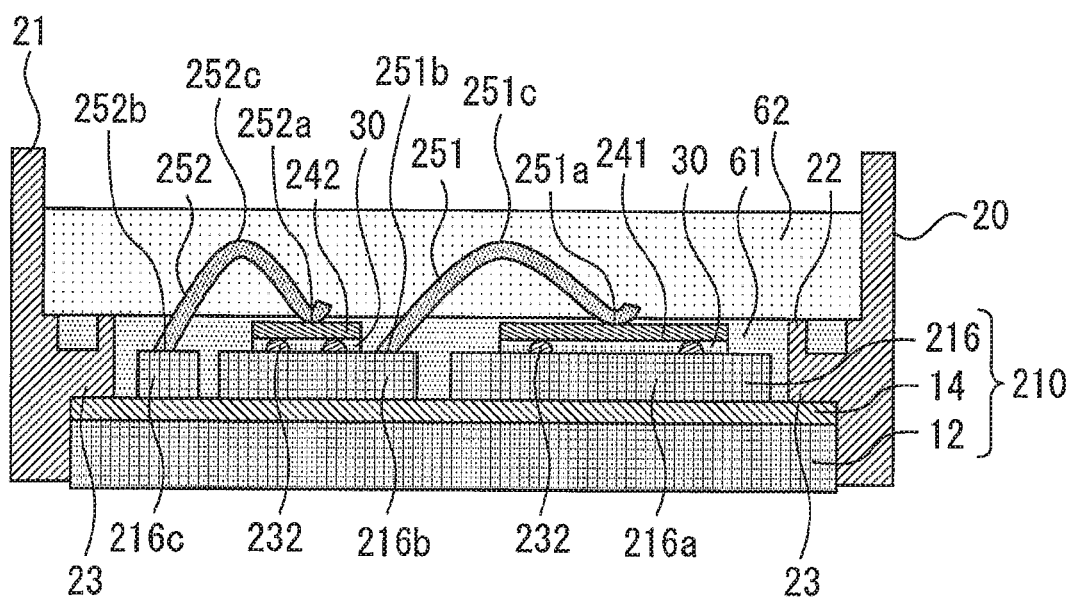
FIG. 12 is a view illustrating a state where the second sealing member has been provided.

Next, second sealing is performed as step 7. FIG. 12 is a view illustrating a state where the second sealing member 62 has been provided. In the second sealing, the upper surface of the first sealing member 61 is sealed with the second sealing member 62 having an elastic modulus lower than that of the first sealing member 61. Thereby, the curved part 251c, 252c are covered with the second sealing member 62.

Then, curing is performed as step 8.

As thus described, in the present embodiment, the two types of sealing members may be provided up to predetermined heights. Therefore, in the sealing step, the resin may only be poured into the case 20, and the manufacturing of the semiconductor device 200 can be facilitated. Further, the height of the sealing member can be controlled stably.

As a modification of the manufacturing method, the case may be attached after the execution of the wire bonding. After the attachment of the case, the wire bonding may further be performed to increase the number of wire bonding steps. The curing may not be performed in step 6, but the curing may be performed altogether in step 8.

Meanwhile, technical features explained in this embodiment may be appropriately combined to use.

In the semiconductor device and the method for manufacturing a semiconductor device according to the present disclosure, the joint part of the semiconductor chip and the bonding wire is covered with the high-modulus first sealing member. The curved part of the bonding wire is covered with the low-modulus second sealing member. Therefore, it is possible to prevent damage to the bonding wire.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2019-178966, filed on Sep. 30, 2019 including specification, claims, drawings and summary, on which the Convention priority of the present application is based, are incorporated herein by reference in its entirety.

The invention claimed is:

1. A semiconductor device, comprising:
an insulating substrate including a base plate;
a first semiconductor chip provided above the base plate;
a bonding wire joined with the first semiconductor chip at a first joint part and having a curved part above the first joint part;
a first sealing member provided from an upper surface of the insulating substrate up to a height higher than the first joint part and lower than the curved part, the first sealing member covering the first joint part; and
a second sealing member provided on the first sealing member covering the curved part and having an elastic modulus lower than an elastic modulus of the first sealing member, wherein
the first joint part is provided on an upper surface of the first semiconductor chip, and
an upper surface of the first sealing member is provided within a range of a wire diameter of the bonding wire from the upper surface of the first semiconductor chip.

2. The semiconductor device according to claim 1, comprising a first circuit pattern provided on the base plate,
wherein the first semiconductor chip is joined to the first circuit pattern by a joint material, and
the first sealing member covers the joint material.

3. The semiconductor device according to claim 1, comprising a second circuit pattern provided on the base plate,
wherein the bonding wire is joined with the second circuit pattern at a second joint part, and
the first sealing member covers the second joint part.

4. The semiconductor device according to claim 1, comprising a case surrounding the base plate,
wherein the case includes a recess having an opening surface at a height of the upper surface of the first sealing member, and
the first sealing member fills the recess.

5. The semiconductor device according to claim 1, comprising
a first bump provided above the base plate,
wherein the first semiconductor chip is provided on the first bump.

6. The semiconductor device according to claim 5, comprising:
a second bump provided above the base plate and shorter than the first bump; and
a second semiconductor chip provided on the second bump and thicker than the first semiconductor chip,
wherein an upper surface of the first semiconductor chip and an upper surface of the second semiconductor chip are level with each other.

7. The semiconductor device according to claim 2, comprising:
a second circuit pattern provided above the base plate and thinner than the first circuit pattern; and
a second semiconductor chip provided on the second circuit pattern and thicker than the first semiconductor chip,
wherein an upper surface of the first semiconductor chip and an upper surface of the second semiconductor chip are level with each other.

8. The semiconductor device according to claim 1, wherein the first semiconductor chip is made with a wide bandgap semiconductor.

9. The semiconductor device according to claim 8, wherein the wide bandgap semiconductor is a silicon carbide-based or gallium nitride-based material or diamond.

10. A method for manufacturing a semiconductor device, comprising:
providing a semiconductor chip above an insulating substrate including a base plate;
joining the semiconductor chip and a bonding wire to form in the bonding wire a curved part above a joint part with the semiconductor chip;
sealing, with the first sealing member, an area provided from an upper surface of the insulating substrate up to a height higher than the joint part and lower than the curved part, to cover the joint part with the first sealing member; and
sealing an upper surface of the first sealing member with a second sealing member having an elastic modulus lower than an elastic modulus of the first sealing member, to cover the curved part with the second sealing member, wherein
the first joint part is provided on an upper surface of the first semiconductor chip, and
an upper surface of the first sealing member is provided within a range of a wire diameter of the bonding wire from the upper surface of the first semiconductor chip.

11. A semiconductor device, comprising:
a base plate;
a first bump provided above the base plate;
a first semiconductor chip provided above the base plate on the first bump;
a second bump provided above the base plate and shorter than the first bump; and
a second semiconductor chip provided on the second bump and thicker than the first semiconductor chip,
a bonding wire joined with the first semiconductor chip at a first joint part and having a curved part above the first joint part;
a first sealing member provided from an upper surface of the base plate up to a height higher than the first joint part and lower than the curved part, the first sealing member covering the first joint part; and
a second sealing member provided on the first sealing member, covering the curved part, and having an elastic modulus lower than an elastic modulus of the first sealing member;
wherein an upper surface of the first semiconductor chip and an upper surface of the second semiconductor chip are level with each other.

12. A semiconductor device, comprising:
a base plate;
a first circuit pattern provided on the base plate;
a second circuit pattern provided above the base plate and thinner than the first circuit pattern;
a first semiconductor chip provided above the base plate;
a second semiconductor chip provided on the second circuit pattern and thicker than the first semiconductor chip;
a bonding wire joined with the first semiconductor chip at a first joint part and having a curved part above the first joint part;
a first sealing member provided from an upper surface of the base plate up to a height higher than the first joint part and lower than the curved part, the first sealing member covering the first joint part; and a second sealing member provided on the first sealing member, covering the curved part, and having an elastic modulus lower than an elastic modulus of the first sealing member, wherein the first semiconductor chip is joined to the first circuit pattern by a joint material, the first sealing member covers the joint material, and an upper surface of the first semiconductor chip and an upper surface of the second semiconductor chip are level with each other.

* * * * *